(12) United States Patent
Toprac

(10) Patent No.: US 6,884,147 B2
(45) Date of Patent: Apr. 26, 2005

(54) METHOD FOR CHEMICAL-MECHANICAL POLISH CONTROL IN SEMICONDUCTOR MANUFACTURING

(75) Inventor: Anthony J. Toprac, Austin, TX (US)

(73) Assignee: Yield Dynamics, Inc., Sunnyvale, CA (US)

( * ) Notice: Subject to any disclaimer, the term of this patent is extended or adjusted under 35 U.S.C. 154(b) by 24 days.

(21) Appl. No.: 10/401,336

(22) Filed: Mar. 28, 2003

(65) Prior Publication Data

US 2004/0198180 A1 Oct. 7, 2004

(51) Int. Cl.$^7$ .................................................. B24B 1/00
(52) U.S. Cl. ........................ 451/5; 451/10; 451/41; 700/97; 700/121
(58) Field of Search .................. 700/97, 121; 438/692, 438/693; 457/5, 41

(56) References Cited

U.S. PATENT DOCUMENTS

| | | | |
|---|---|---|---|
| 6,113,462 A | * | 9/2000 | Yang .............................. 451/5 |
| 6,169,931 B1 | * | 1/2001 | Runnels ......................... 700/97 |
| 6,230,069 B1 | * | 5/2001 | Campbell et al. ............ 700/121 |
| 6,276,989 B1 | * | 8/2001 | Campbell et al. .............. 451/10 |
| 6,517,412 B1 | * | 2/2003 | Lee et al. ........................ 451/5 |
| 6,572,443 B1 | * | 6/2003 | Beckage et al. ................ 451/6 |
| 6,572,445 B1 | * | 6/2003 | Laursen ........................ 451/10 |
| 6,587,744 B1 | * | 7/2003 | Stoddard et al. ............ 700/121 |
| 6,625,513 B1 | * | 9/2003 | Lymberopoulos et al. ... 700/121 |
| 6,676,492 B1 | * | 1/2004 | Li ................................ 451/65 |
| 6,720,266 B1 | * | 4/2004 | Hofmann et al. ........... 438/692 |

* cited by examiner

Primary Examiner—George Nguyen
(74) Attorney, Agent, or Firm—Russo & Hale LLP; William C. Milks, III

(57) ABSTRACT

A method for planarizing the surface of a semiconductor wafer or device during manufacture. Dependencies of polish rate and substrate thickness on process parameters of downforce and polish speed, and on the characteristic product high feature area on the wafer, are explicitly defined and used to control Chemical-Mechanical Polish in Run-to-Run and real-time semiconductor production control applications.

23 Claims, 5 Drawing Sheets

METHOD FOR CHEMICAL-MECHANICAL POLISH CONTROL IN SEMICONDUCTOR MANUFACTURING

BACKGROUND OF THE INVENTION

1. Field of the Invention

The present invention relates to semiconductor processing and, more particularly, to planarizing the surface of a semiconductor wafer or device during manufacture. Specifically, one embodiment of the present invention provides a method in which dependencies of polish rate and post-polish substrate thickness on process parameters of downforce, polish pad spring constant and polish speed, and on product characteristics of high feature area on the wafer, low feature area on the wafer, pre-polish thickness of high feature areas on the wafer, and pre-polish thickness of low features on the wafer, are explicitly defined and used to control Chemical-Mechanical Polish in Run-to-Run and real-time semiconductor production control applications.

2. Description of the Prior Art

Chemical-Mechanical Polish (CMP) is an important process in microelectronic manufacturing. In this process, a silicon wafer with topographic variation on the wafer surface is polished with sufficient material removal that the wafer surface is effectively planarized, i.e., treated to have a substantially flat surface. Generally, the density, height, and geometric form of the topographic variation on the wafer surface is specific to the product and manufacturing process used by the manufacturer.

Known CMP tools, such as the Applied Materials Mirra, polish by forcing the uneven wafer surface into contact with an abrasive polish pad that is in motion with respect to the wafer surface. Typically, this motion is produced by rotation of a platen on which the pad is mounted. The platen is usually several times larger than the wafer. In addition to platen rotation, the wafer itself rotates about its center point. An alternative to this typical configuration is the Lam Research polish tool, which uses a circulating belt, rather than a rotating platen, to polish a wafer.

All known CMP tools distribute a liquid slurry across the polish pad. This slurry provides both an abrasive mechanical, as well as reactive chemical, effect that removes material from the wafer surface.

An additional aspect of polish tools is the conditioning of the polish pad between wafer polishes. This conditioning typically involves an abrasive or cutting element, such as a diamond wheel, which works across the pad surface to restore the roughness of the pad.

Often, planar wafers (that is, wafers without any appreciable surface topography) are polished in order to measure the gross removal rate of the polish tool. Typically, this action is performed after a maintenance event to qualify the tool for standard production wafers. The polish of these non-production wafers represents a cost overhead burden to the manufacturer and is minimized as much as possible.

Another technique used to quality a polish tool after a maintenance event is polishing a sample wafer or wafers from a production lot. The pre- and post-polish measurements can then be used to calculate an effective tool polish rate, and the polish time or other recipe variables are adjusted such that the bulk of the lot achieves the targeted post-polish substrate film thickness. This method also carries a cost overhead burden for the manufacturer, since the "send-ahead" sample wafer(s) are usually under-polished. Underpolished wafers can receive a second polish, termed a "rework," to bring them to required specification; in contrast, over-polished wafers are scrapped. Reworking wafers, while avoiding scrapping of product, nonetheless carries a cost in specialized engineering attention to tailor the polish recipe to the particular requirements of the rework wafers at hand, and additionally prevents the polish tool from running normal production wafers.

Batch control schemes, termed "Run-to-Run" (R2R) control in semiconductor manufacturing, use pre-process measurements as feed forward information and post-process measurements as feedback information in conjunction with a control model to make updates to the operating recipe of the process. Standard implementations of R2R control as applied to the CMP process typically employ a simple linear model that relates polish time to the amount of material removal.

SUMMARY OF THE INVENTION

The present invention replaces the known simple models with a model that is based on the physics of the polish process. As a result, the dependencies of polish rate and substrate thickness on process parameters of downforce, polish pad spring constant and polish speed, and on product characteristics of high feature area on the wafer, low feature area on the wafer, pre-polish thickness of high feature areas on the wafer, and pre-polish thickness of low features on the wafer, are explicitly defined. As a result, the control model in accordance with the present invention supports enhanced functionality for CMP R2R control schemes, such as using downforce or polish speed as manipulated variables in conjunction with polish time, support for the introduction of new products based on photomask characteristics, and the automation of recipe calculation for waters requiring rework. The CMP control model in accordance with the present invention also allows for a novel method of real-time control using in-situ thickness measurement sensors to provide improved end point times for the polish.

The foregoing and other objects, features, and advantages of the present invention will become more readily apparent from the following detailed description of a preferred embodiment which proceeds with reference to the accompanying drawings.

BRIEF DESCRIPTION OF THE DRAWINGS

The various embodiments of the present invention will be described in conjunction with the accompanying figures of the drawings to facilitate an understanding of the present invention. In the figures, like reference numerals refer to like elements. In the drawings.

DETAILED DESCRIPTION OF THE PREFERRED EMBODIMENTS

The basis of the Chemical-Mechanical Polish (CMP) control method in accordance with one embodiment of the present invention rests on a description of the conditions of full, partial, or no contact between the polish pad and the wafer surface's "valleys" (down features). The CMP control method of the present invention therefore pertains to three distinct operating regimes in chemical-mechanical polishing, namely, full contact of valleys by the polish pad, no pad contact of valleys, and a transition regime between no contact and full contact of valleys.

Full Contact Regime

Figure 1:
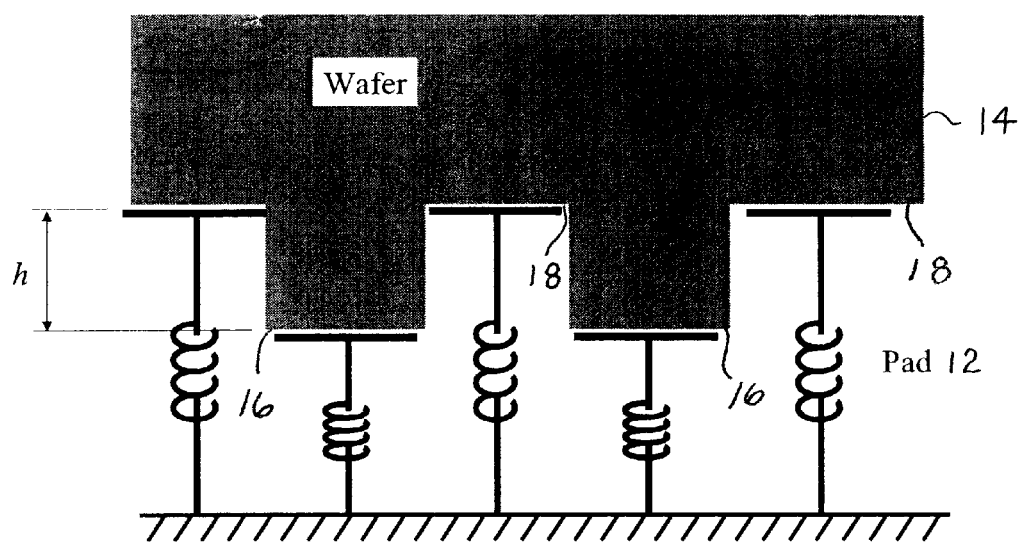
FIG. 1 illustrates a spring model in which a polish pad is modeled as a linear spring with the wafer's surface features, mesas of height h above valleys, forced into the pad.

The basis of the Full Contact Regime model is contact between the polish pad and the wafer surface's "mesas" (up features) and "valleys" (down features). As illustrated in FIG. 1, a polish pad 12 is modeled as a linear spring with the surface features of a wafer 14, including mesas 16 of height h above valleys 18, forced against the pad.

With a positive distance y defined in the downward direction of FIG. 1, a force balance on the wafer 14 is given by:

$$-F_m - F_v = F_{dn}, \quad [1]$$

where $F_{dn}$=(+) downforce pushing the wafer 14 into the polish pad 12, dynes $F_v$=(−) pad reaction force distributed across all wafer valleys 18, dynes $F_m$=(−) pad reaction force distributed across all wafer mesas 16, dynes A variable R is used for removal rates, which are defined as:

$R_p$=(−) planar wafer removal rate, microns/sec.

$R_v$=(−) removal rate in valleys, microns/sec.

$R_m$=(−) removal rate on mesas, microns/sec.

Preston's equation for polish processes gives:

$$R_p = -CS \frac{F_{dn}}{A_w} \quad [2]$$

$$R_v = CS \frac{F_v}{A_v} \quad [3]$$

$$R_m = CS \frac{F_m}{A_m} \quad [4]$$

where

C=Preston's coefficient

S=pad-to-wafer substrate speed, cm/sec $A_i$=total area of mesas (i=m), valleys (i=v), or wafer surface (i=w), $cm^2$ See, F. W. Preston, *J. Soc. Glass Technol.*, 11, 214 (1927).

Equations 2, 3, and 4 can be solved for respective forces $F_{dn}$, $F_v$, and $F_m$ and substituted into Equation 1. Dividing this result through by CS gives:

$$-A_m R_m - A_v R_v = -A_w R_p \quad [5]$$

Mesa and valley areas sum to wafer area, $A_m + A_v = A_w$, or $$A_v = A_w - A_m \quad [6]$$

Substituting Equation 6 into Equation 5 gives:

$$A_m R_m + (A_w - A_m) R_v = A_w R_p \quad [7]$$

One can define a quantity M to be the dimensionless ratio of mesa area to total wafer area $$M = A_m / A_w \quad [8]$$

Dividing Equation 7 by $A_w$ and substituting Equation 8 into the result gives:

$$MR_m + (1-M) R_v = R_p \quad [9]$$

Solving Equation 9 for $R_v$ gives:

$$R_v = \frac{(R_p - MR_m)}{1-M} \quad [10]$$

The total indicated runout (tir) rate is defined as the difference in rate between the mesas and the valleys $$R_{tir} = R_m - R_v, \quad [11]$$

and from Preston's equation $$R_{tir} = CS \frac{F_{tir}}{A_m} \quad [12]$$

Using, Hooke's law, the differential mesa-to-valley force $F_{tir}$ is a linear function of the difference in pad compression between the mesas and valleys.

In the Full Valley Contact Regime, this compression distance is given by h, the height of the mesas 16 above the valleys 18. Hooke's law therefore gives:

$$F_{tir} = -kA_m h \quad [13]$$

where k Hooke's spring constant, dynes/$cm^2$-microns

Substituting Equation 13 into Equation 12 gives:

$$R_{tir} = dh/dt = -kCSh \quad [14]$$

where $R_{tir}$ represents the rate of change in height h (microns) over time t (sec). Integrating Equation 14 from initial height $h_0$ at time zero to height h at time t gives an expression for the evolution of mesa-to-valley height over time:

$$h = h_0 \exp(-kCSt) \quad [15]$$

Substituting Equation 15 into Equation 14 defines the evolution of $R_{tir}$ in time:

$$R_{tir} = -kCSh_0 \exp(-kCSt) \quad [16]$$

An expression for instantaneous mesa removal rate $R_m$ and mesa thickness $y_m$ as a function of time and other polish variables can now be developed. Rearranging Equation 11 and substituting the expression for $R_v$ from Equation 10 results in $$R_m = \frac{(R_p - MR_m)}{1-M} + R_{tir} \quad [17]$$

Solving Equation 17 for $R_m$ gives:

$$R_m = R_p + (1-M) R_{tir} \quad [18]$$

Substituting Equation 16 for $R_{tir}$ into Equation 18 gives:

$$R_m = R_p - (1-M)kCSh_0 \exp(-kCSt) \quad [19]$$

The quantity CS in Equation 19 can be solved for in terms of known quantities by rearranging Equation 2 as follows:

$$-CS = R_p \frac{A_w}{F_{dn}} \qquad [20]$$

Substituting Equation 20 into Equation 19 gives the final form for the model equation of $R_m$, the instantaneous removal rate of material of thickness $y_m$ on the mesas:

$$R_m = dy_m/dt = R_p + (1-M)(R_p A_w/F_{dn})kh_0 \exp(kR_p A_w t/F_{dn}) \qquad [21]$$

Equation 21 can be integrated from initial mesa thickness $y_{m0}$ at time zero to thickness $y_m$ at time t to give the following model equation for mesa thickness:

$$y_m = y_{m0} + R_p t + (1-M)(y_{m0} - y_{v0})[\exp(kR_p A_w t/F_{dn}) - 1] \qquad [22]$$

where $y_v$ is the thickness measured in the valley regions and $(y_{m0} - y_{v0})$ represents the difference in the initial time zero thicknesses between mesa and valley regions, a quantity identical to $h_0$. Note that $R_p$ is always negative. Also, mesa and valley thicknesses are assumed to be measured with respect to a planar substrate. In the case of a nonplanar substrate, measured thicknesses in mesas and valleys are preferably corrected for the offset associated with the non-planarity of the underlying reference layer.

No Valley Contact Regime

In contrast to the Full Contact Regime model, the basis of the No Valley Contact Regime model is that the polish pad 12 is in contact with only the high, or mesa, features on the wafer surface. The resulting removal rate on the mesas 16 is related directly to the planar wafer removal rate as follows:

$$R_p = -CS \frac{F_{dn}}{A_w} \qquad [23]$$

$$R_m = -CS \frac{F_{dn}}{A_m} \qquad [24]$$

$$R_m = \frac{A_w}{A_m} R_p = \frac{R_p}{M} \qquad [25]$$

Thickness measured on the mesas 16 as a function of time is given by $$y_m = y_{mo} + \frac{R_p t}{M} \qquad [26]$$

Transition Regime

The Transition Regime model predicts the time and feature height h of the mesas 16 above the valleys 18 at which contact with the valleys first occurs. At that point in time, the model of the CMP process chances from the No Valley Contact Regime to the Full Contact Regime as detailed above. At the initialization of the Full Contact Regime, the Transition Regime model provides the Full Contact Regime model an estimate of the starting time and starting feature height h.

Initially, the No Valley Contact Regime model predicts a constant removal rate on the mesas 16 (Equation 25). The removal rate on the mesas 16 at the initial point of valley contact by the polish pad 12 can therefore be written as:

$$R_m = \frac{h_c - h_o}{t_c} = \frac{R_p}{M} \qquad [27]$$

where
$t_c$ = critical time of first pad contact in valleys 18
$h_c$ = critical height from mesa 16 to valley at time of initial pad contact
$h_0$ = initial height from mesa to valley at time zero At first polish pad contact in the valleys 18, the No Valley Contact Regime model rate (Equation 25) and Full Contact Regime model rate (Equation 21) are equal. Further, the Full Contact Regime model is at an effective time zero at the moment of first valley contact by the polish pad 12. This reduces Equation 21 to $$R_m = R_p + kh_c(1-M)(R_p A_w/F_{dn}) \qquad [28]$$

Setting the two model rates (i.e., the No Valley Contact rate (Equation 25) and Full Contact rate (Equation 21)) equal therefore gives:

$$\frac{R_p}{M} = R_p + kh_c(1-M)(R_p A_w/F_{dn}) \qquad [29]$$

Dividing through by $R_p$ and rearranging gives an expression for the critical height $h_c$:

$$h_c = \frac{F_{dn}}{kA_w M} \qquad [30]$$

The critical time $t_c$ is given by rearranging Equation 27 with the above expression for $h_c$ from Equation 30 substitituted:

$$t_c = \frac{M\left(\frac{F_{dn}}{kA_w M} - h_o\right)}{R_p} = \frac{F_{dn} - MkA_w h_o}{kA_w R_p} \qquad [31]$$

The critical mesa thickness, $y_{m0}$, is given by the critical height above the initial valley thickness:

$$y_{mc} = y_{v0} + h_c \qquad [32]$$

SUMMARY of CMP Control Model

The CMP control model in accordance with the present invention is represented by the No Valley Contact Regime model for polish time less than the critical polish time as predicted by the Transition Regime model, and the Full Contact Regime model for time greater than the critical polish time. At critical polish time, the two models are equivalent. The Full Contact Regime model dependencies on initial feature height and time are provided by the Transition Regime model. This can be summarized in equation form as:

$$t_c = \frac{F_{dn} - MkA_w(y_{mo} - y_{vo})}{kA_w R_p} \qquad [M1]$$

For $t \leq t_c$, $$R_m = \frac{R_p}{M} \qquad [M2]$$

-continued $$y_m = y_{mo} + \frac{R_p t}{M} \quad [M3]$$

For $t > t_c$, $$R_m = R_p + (1-M)(R_p A_w/F_{dn})h_c k \exp(kR_p A_w(t-t_c)/F_{dn}) \quad [M4]$$

$$y_m = (y_{v0}+h_c) + R_p(t-t_c) + (1-M)h_c[\exp(kR_p A_w(t-t_c)/F_{dn}) - 1] \quad [M5]$$

where the term $(y_{v0}+h_c)$ represents the critical mesa height $y_{mc}$, and $h_0$ and $h_c$ are given by $$h_0 = y_{m0} - y_{v0} \quad [M6]$$

$$h_c = \frac{F_{dn}}{kA_w M} \quad [M7]$$

It is possible to write the equation for $R_m$ for $t > t_c$ without a dependence on k by solving Equation 29 for k and substituting back into Equation 21 to obtain $$R_m = R_p[1 + \{(1-M)/M\} \exp(R_p(t-t_c)/(Mh_c))] \quad [M8]$$

$$y_m = y_{v0} + h_c + R_p(t-t_c) + (1-M)h_c[\exp(R_p(t-t_c)/Mh_c) - 1] \quad [M9]$$

which expresses the mesa rate equation in terms of just $R_p$, M, and $h_c$. The ratio $(h_c M/R_p)$ then takes the form of a simple decay rate.

In addition to polish time, downforce and polish speed may be used as manipulated variables in a control method. In this case, the dependency of $R_p$ on downforce, given by Equation 23, can be used $$R_p = -CS\frac{F_{dn}}{A_w} \quad [M10]$$

where the constant C is identified empirically using measurements of planar polish rate $R_p$ at known polish speed S and down force $F_{dn}$.

Method of CMP Control Model Use

The CMP control method in accordance with the present invention based on the model as given by Equations M1 through M10 can be used in two different control applications, namely, Run-to-Run control and real-time control. An embodiment of each CMP process control method is described in more detail below.

Run-to-Run CMP Control

One embodiment of the CMP control method in accordance with the present invention can be used in batch control schemes termed "Run-to-Run" (R2R) control as applied in semiconductor manufacturing. R2R control uses pre-process measurements as feed forward information and post-process measurements as feedback information in conjunction with a control model to make updates to the operating recipe of the semiconductor manufacturing process. In this embodiment of the present invention, the CMP control method is used with pre-polish thickness measurements and post-polish thickness measurements to provide updates to the CMP process tool recipe. One embodiment of the CMP R2R control method in accordance with the present invention is as follows.

Identification of Pad Compression Spring Constant k

Figure 2:
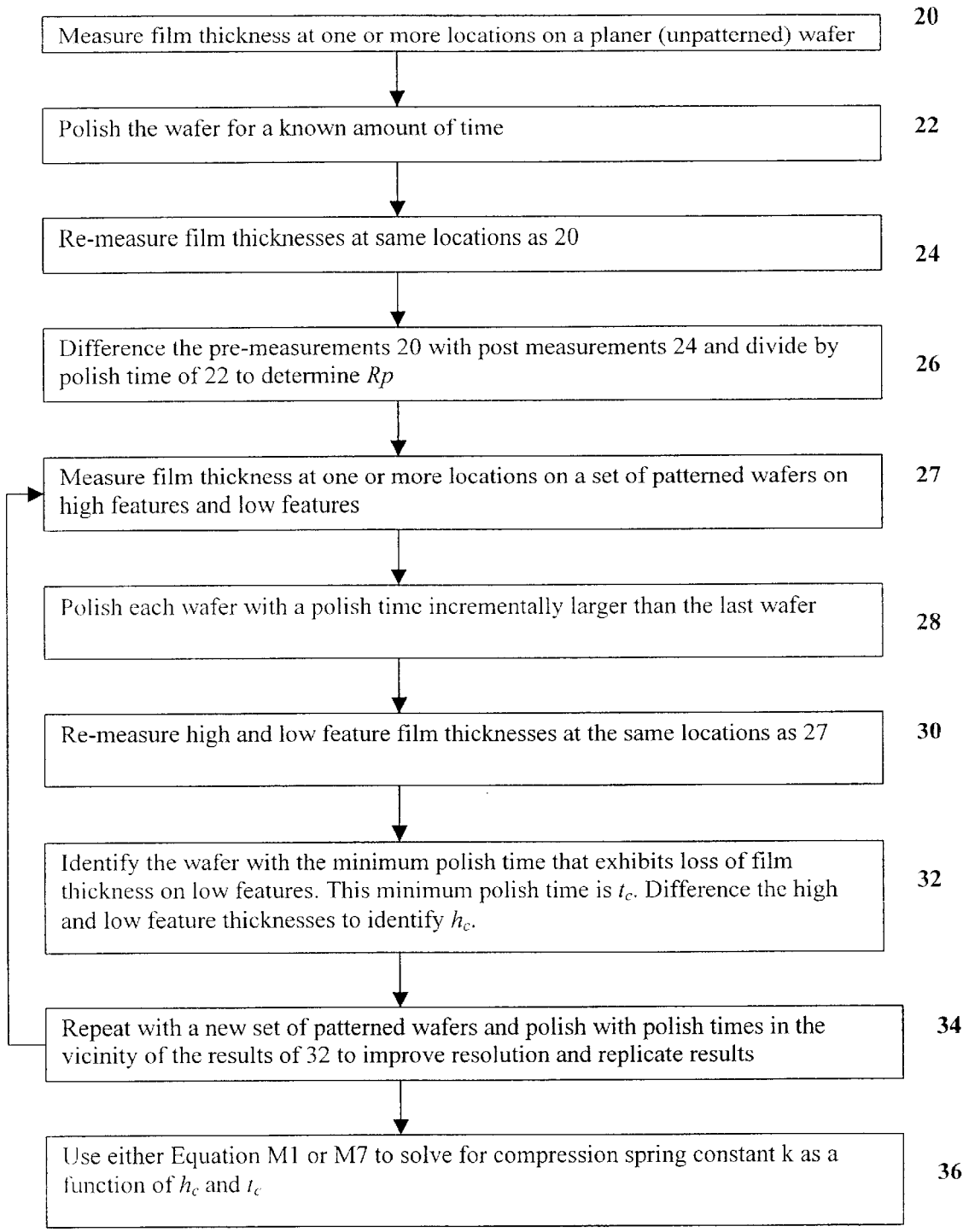
FIG. 2 is a flow diagram of one method for determining the spring constant k of the polish pad shown in FIG. 1.

The polish pad compression spring, constant k that appears in Equations M1, M4, M5, and M7 is preferably determined as follows:

1. Determine the planar wafer polish rate $R_p$ according to the following steps shown in FIG. 2:
    a. Measure the substrate film thickness at one or more identifiable locations on a planar (unpatterned) wafer, as indicated by the numeral 20 shown in FIG. 2.
    b. Polish the wafer for a metered amount of time, as indicated by the numeral 22 shown in FIG. 2.
    c. Re-measure the substrate film thickness at the same locations as in Step 1a, above, as indicated by the numeral 24 shown in FIG. 2.
    d. Difference the measurements (Step 1c measurements minus Step 1a measurements), average the results, and divide by the polish time to calculate $R_p$, the planar wafer polish rate, as indicated by the numeral 26 shown in FIG. 2.
2. On a set of patterned wafers, measure high feature and low feature thicknesses at one or more identifiable locations, as indicated by the numeral 27 shown in FIG. 2.
    a. Measure feature thickness at one or more identifiable locations on the wafer. The first such measurement (before any polishing) determines the values of $y_{m0}$ (high features) and $y_{v0}$ (low features).
    b. Subsequent measurements after the first post-polish measurements determine the values of $y_m$ (high features) and $y_v$ (low features).
3. Polish the set of patterned wafers sequentially with incremental polish times, the increments being typically 5 to 30 seconds, as indicated by the numeral 28 shown in FIG. 2. For example, the first wafer receives a 5-second polish, the second wafer a 10-second polish, third 15-second polish, and so forth. The increment in polish time multiplied by the number of wafers in the set preferably equals or exceeds the polish time normally used for the given set of patterned wafers in order to assure that the critical polish time is exceeded by one or more of the polish times used.
4. Re-measure high feature and low feature thickness on each wafer at the same locations as Step 2, above, as indicated by the numeral 30 shown in FIG. 2.
5. Identify the wafer with the minimum polish time that has low feature thickness loss, as indicated by the numeral 32 shown in FIG. 2. This wafer's polish time is the critical polish time for the set of wafers. The high and low feature thickness difference identifies $h_c$ for the set of wafers.
6. Repeat Steps 1 through 5 to improve resolution (polish with times in the vicinity of the result in Step 6) and replicate results as needed, as indicated by the numeral 34 shown in FIG. 2.
7. When an adequately repeatable and accurate result for $t_c$ and $h_c$ is obtained, either Equation M1 or M7 is used to solve for k given the values of $t_c$ and $h_c$ identified as described above, as indicated by the numeral 36 shown in FIG. 2.

Alternative Method of Identification of Spring Constant k

Figure 3:
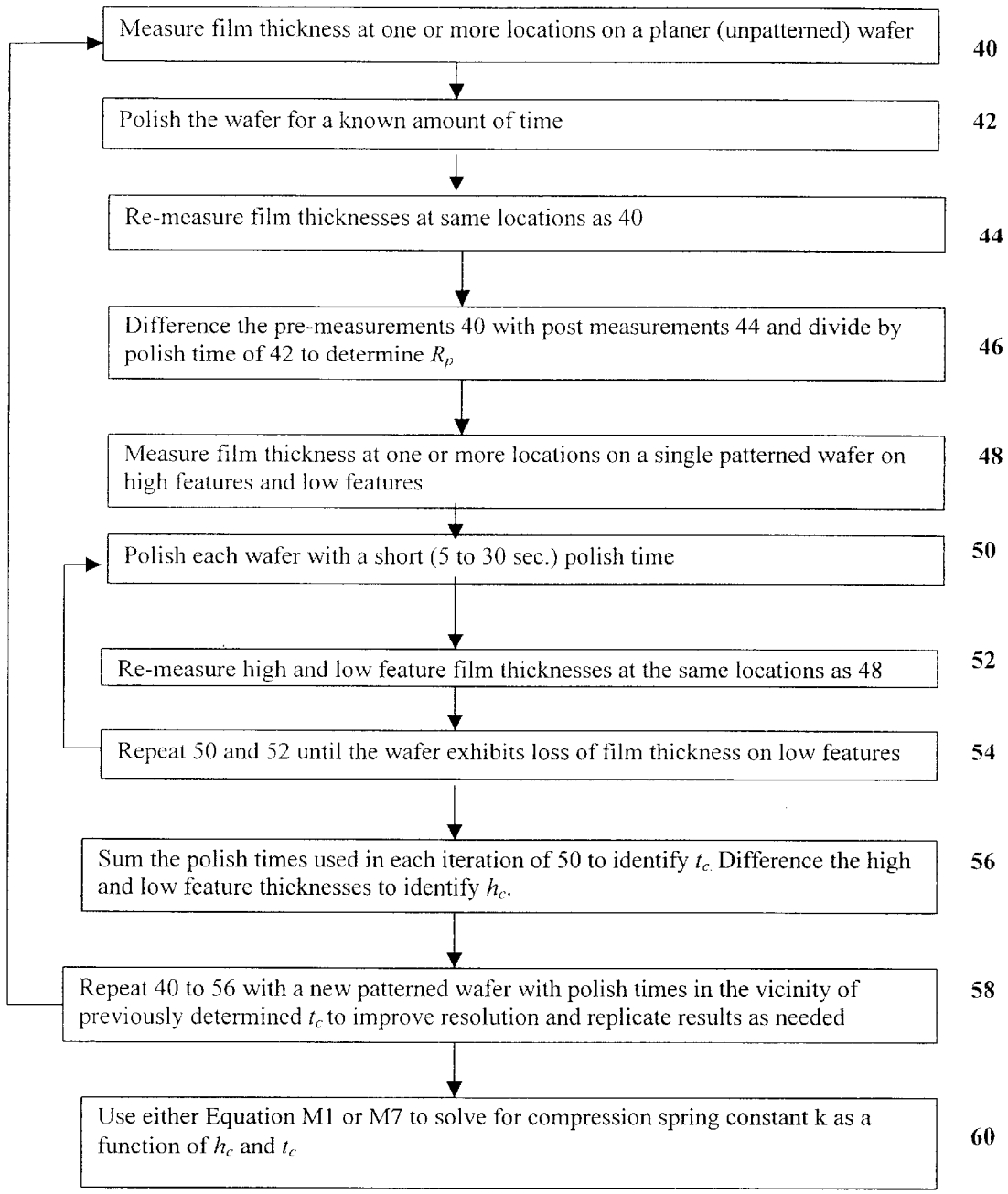
FIG. 3 is a flow diagram of an alternative method for determining the spring constant k of the polish pad shown in FIG. 1.

The following alternative method, shown in FIG. 3, employs a single patterned wafer in the determination of constant k but is more disruptive of normal production.

1. Determine the planar wafer polish rate $R_p$ according to the following steps:
    a. Measure the substrate film thickness at one or more identifiable locations on a planar (unpatterned) wafer, as indicated by the numeral 40 shown in FIG. 3.

b. Polish the wafer for a metered amount of time, as indicated by the numeral 42 shown in FIG. 3.

c. Re-measure the substrate film thickness at the same locations as in Step 1a, above, as indicated by the numeral 44 shown in FIG. 3.

d. Difference the measurements (Step 1c measurements minus Step 1a measurements), average the results, and divide by the polish time to calculate $R_p$, the planar wafer polish rate, as indicated by the numeral 46 shown in FIG. 3.

2. On a patterned wafer, measure high feature and low feature thicknesses at one or more identifiable locations, as indicated by the numeral 48 shown in FIG. 3.

a. Measure feature thickness at one or more identifiable locations on the wafer. The first such measurement (before any polishing) determines the values of $y_{m0}$ (high features) and $y_{v0}$ (low features).

b. Subsequent measurements after the first post-polish measurements determine the values of $y_m$ (high features) and $y_v$ (low features).

3. Polish this patterned wafer for a short (typically 5 to 30 sec.) metered amount of time, as indicated by the numeral 50 shown in FIG. 3.

4. Re-measure high feature and low feature thickness at the same locations as Step 2, above, as indicated by the numeral 52 shown in FIG. 3.

5. Repeat Steps 3 and 4, until low feature thickness loss is noted, as indicated by the numeral 54 shown in FIG. 3.

6. Cumulative polish time obtained by summing the time of each polish of Step 3 is the estimate for $t_c$; high minus low feature thickness is estimate for $h_c$, as indicated by the numeral 56 shown in FIG. 3.

7. Repeat Steps 1 through 6 to improve resolution (polish with times in the vicinity of the result in Step 6), and replicate results as needed, as indicated by the numeral 58 shown in FIG. 3.

8. When an adequately repeatable and accurate result for $t_c$ and $h_c$ is obtained, either Equation M1 or M7 is used to solve for k given the values of $t_c$ and $h_c$ identified as described above, as indicated by the numeral 60 shown in FIG. 3.

Use of the CMP R2R Control Model for Production Wafer Polish

Figure 4:
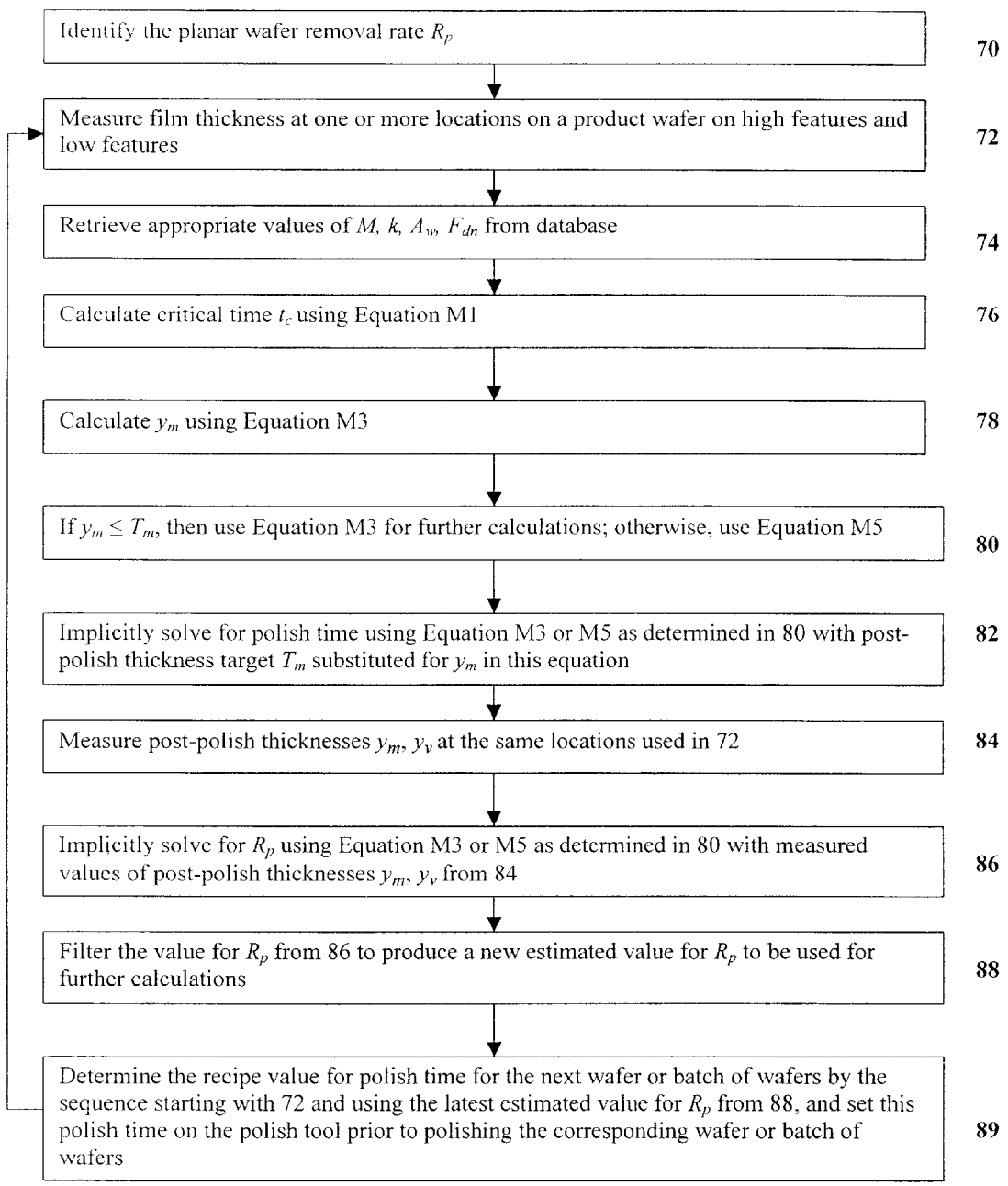
FIG. 4 is a flow diagram of closed loop R2R control of chemical-mechanical polish (CMP) using the CMP control method in accordance with one embodiment of the present invention.

The CMP R2R control method is used to control production of wafer polish as follows, as shown in FIG. 4.

1. Initialize production on the CMP tool by determining the planar wafer polish rate $R_p$, as described in Step 1 of Identification of Pad Compression Spring Constant k, above, as indicated by the numeral 70 shown in FIG. 4.

2. Measure incoming production wafer high ($y_{m0}$) and low ($y_{v0}$) feature thickness at one or more identifiable locations on the wafer, as indicated by the numeral 72 shown in FIG. 4.

3. The appropriate values for M, determined by the high feature area of the specific product being polished, spring constant k, wafer area $A_w$, and $F_{dn}$, the downforce value set in the polish recipe, are retrieved from a database, as indicated by the numeral 74 shown in FIG. 4. Values of M are set in the database by obtaining the value of mask-scale or reticle mask-scale M, from the photomask manufacturer for the given product's photomask, or by calculating the value of mask-scale or reticle mask-scale M from $A_m$ or $A_v$ as provided by the photomask manufacturer and using the following equations:

$$M = A_m/A_w, \text{ or}$$

$$M = (A_w - A_v)/A_w,$$

or, alternatively, by calculating a local M from known or measured values of $A_m$ in a prescribed area $A_p$ surrounding the location of thickness measurements and using the formula $$M = A_m/A_p$$

Or, alternatively, M is calculated as a weighted average of a mask-scale or reticle mask-scale M and a local M as defined above.

4. Calculate critical time constant $t_c$ using Equation M1, as indicated by the numeral 76 shown in FIG. 4.

5. As indicated by the numeral 78 shown in FIG. 4, substitute critical time constant $t_c$ into Equation M3 as follows:

$$y_m = y_{mo} + \frac{R_p t_c}{M}$$

and perform the following conditional logic, as indicated by the numeral 80 shown in FIG. 4:

If $y_m \leq T_m$, where $T_m$ is the post-polish thickness target, then use Equation M3 in Step 6, below; otherwise, use Equation M5.

6. Implicitly solve for polish time from Equation M3 or M5 as determined in Step 5, above, with target $T_m$ substituted for $y_m$, as indicated by the numeral 82 shown in FIG. 4. Implicit solutions can be performed by a variety of well-known textbook methods. The following example uses minimization of a quadratic objective function $\Phi$:

Minimize $\Phi$ over the allowed range of polish times t where $$\Phi = \left\{ T_m - \left[ y_{mo} + \frac{R_p t}{M} \right] \right\}^2$$

for Equation M3 selected in Step 5;

$$\Phi = \{T_m - (y_{v0} + h_c + R_p(t-t_c) + (1-M)h_c[\exp(kR_pA_w(t-t_c)/F_{dn})-1])\}^2$$

for Equation M5 selected in Step 5, where the upper and lower allowed limits of the manipulated variable of polish time t are respectively indicated by u and l subscripts and are such that $$t_l \leq t \leq t_u$$

7. Measure post-polish $y_m$, $y_v$ at the same locations used in Step 2, above, as indicated by the numeral 84 shown in FIG. 4.

8. Implicitly solve Equation M3 or M5, as determined in Step 5, above, for $R_p$ using measurements from Step 7, above, as indicated by the numeral 86 shown in FIG. 4. The following example uses minimization of a quadratic objective function $\Phi$:

Minimize $\Phi$ over the allowed range of planar polish rates $R_p$ where $$\Phi = \left\{ y_m - \left[ y_{mo} + \frac{R_p t}{M} \right] \right\}^2$$

for Equation M3 selected in Step 5;

$$\Phi = \{y_m - (y_{vo} + h_c + R_p(t-t_c) + (1-M)h_c[\exp(kR_p A_w(t-t_c)/F_{dn})-1])\}^2$$

for Equation M5 selected in Step 5, where $y_m$ is the measurement obtained in Step 7, above.

9. Filter the new value for $R_p$ to produce a new estimated value of $R_p$ to be used in Steps 2 through 6, above, for the next wafer or batch of wafers to be polished, as indicated by the numeral 88 shown in FIG. 4. Any of a variety of textbook filter methods, such as Kalman or EWMA filters, can be used. The following example uses EWMA filtering:

$$R_p,\text{new\_estimate} = \lambda*(R_p,\text{new\_value}) + (1-\lambda)*R_p,\text{old\_estimate}$$

where the EWMA filter constant $\lambda$ has a value between 0 and 1

10. Determine the recipe value for polish time for the next wafer or batch of wafers to be polished by repeating the above sequence starting with Step 2, above, for this next wafer or batch of wafers using the new estimated value of $R_p$ determined in Step 9, above, as indicated by the numeral 89 shown in FIG. 4. This recipe value for polish time is set on the polish tool prior to polishing the corresponding wafer or batch of wafers.

Contemplated Modifications in Use of CMP R2R Control Method for Production Wafer Polish The following alternatives to the above sequence of steps comprising the CMP R2R control method are contemplated.

In Step 1, above, a planar wafer polish is not performed. Instead, Steps 2 through 9, above, are performed using a nominal value for $R_p$ to polish the first wafer or batch of wafers.

In Step 6, above, calculation of the adjustment to the polish tool recipe is made for a manipulated variable other than polish time, specifically, one of the following recipe variables that are present in the CMP control model equations: $F_{dn}$ (downforce) or S (platen speed), where platen speed is the velocity of the polish pad with respect to the polished wafer. Best use of either $F_{dn}$ or S as manipulated variables requires the following changes to the controller sequence:

a. The expression for $R_p$ given in Equation M10 is used. Wherever $R_p$ is used in the above sequence, it is replaced by the expression $$-CS\frac{F_{dn}}{A_w}$$

Updates to $R_p$ as given in Steps 8 and 9, above, are now performed to identify the value of the C parameter.

b. Step 6 in the above sequence is performed as follows: Implicitly solve for platen speed or downforce from model Equation M3 or M5 as determined in Step 5, above, with target $T_m$ substituted for $y_m$. Implicit solutions can be performed by a variety of well-known textbook methods. The following example uses minimization of a quadratic objective function $\Phi$:

Minimize $\Phi$ over the allowed range of downforce $F_{dn}$ or platen speed S where $$\Phi = \left\{ T_m - \left[ y_{mo} + \frac{-CS\frac{F_{dn}}{A_w}t}{M} \right] \right\}^2$$

for Equation M3 selected in Step 5;

$$\Phi = \left\{ T_m - \left( y_{vo} + h_c - CS\frac{F_{dn}}{A_w}(t-t_c) + (1-M)h_c[\exp(-kCS(t-t_c))-1] \right) \right\}^2$$

for Equation M5 selected in Step 5, where the upper and lower allowed limits of the manipulated variables are respectively indicated by u and l subscripts and are such that $$F_{dn-l} \leq F_{dn} F_{dn-u}$$

$$S_l \leq S \leq S_u$$

c. In Step 10, above, determine the recipe value for downforce $F_{dn}$ or platen speed S for the next wafer or batch of wafers to be polished by repeating the above sequence starting with Step 2, above, for this next wafer or batch of wafers using the new estimated value of $R_p$ determined in Step 9, above. This recipe value for downforce $F_{dn}$ or platen speed S is set on the polish tool prior to polishing the corresponding wafer or batch of wafers.

The use of manipulated variables is sequenced. For example, polish time is used as the manipulated variable until the maximum allowed time $t_u$ is used, whereupon the manipulated variable is changed to downforce. The event that causes a change of manipulated variable is the saturation of the present manipulated variable at either the high or low allowed limit.

Real-Time CMP Control Method for Production Wafer Polish

Figure 5:
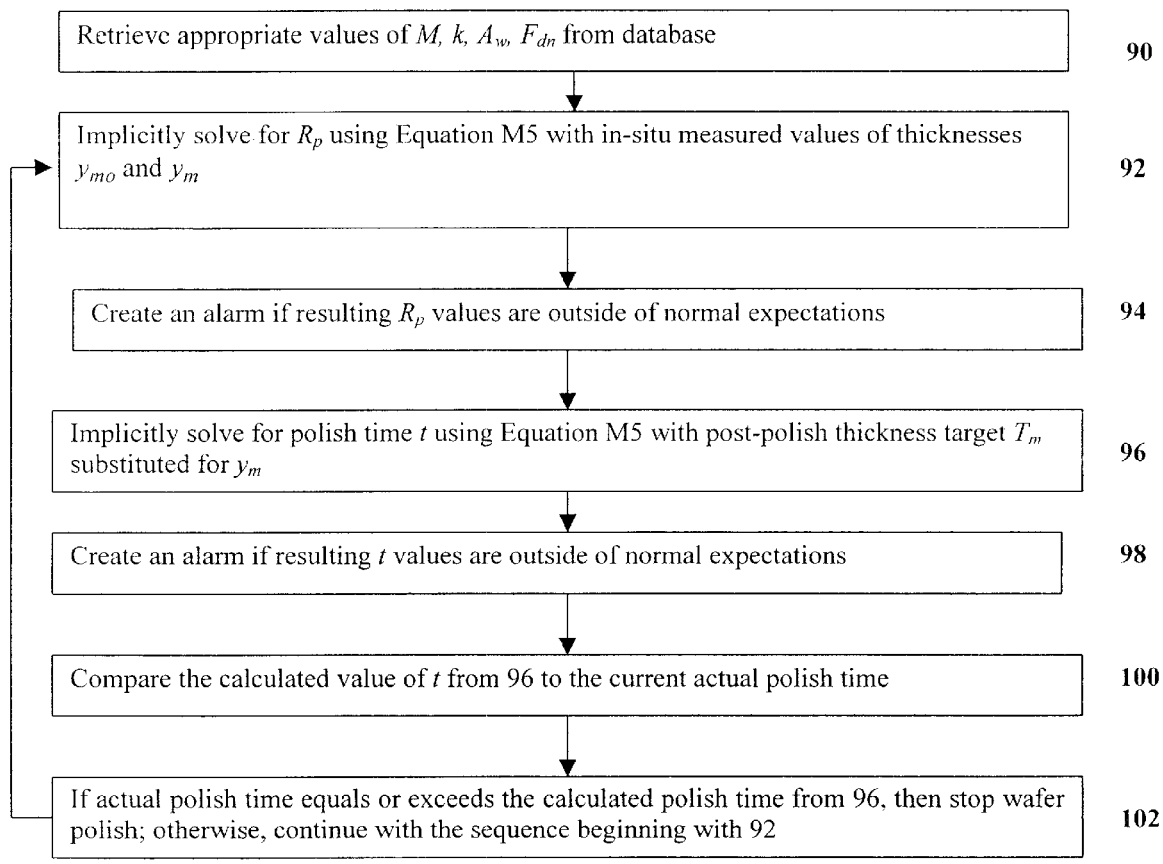
FIG. 5 is a flow diagram of real-time control of chemical-mechanical polish (CMP) using the CMP control method in accordance with another embodiment of the present invention.

In addition to use in the batch method of R2R control as described above, the CMP control method in accordance with the present invention can be used for real-time control. In this embodiment of the present invention, in-situ thickness measurement of the wafer substrate thickness is used to update the $R_p$ model parameter. Updated by this step, the CMP control method predicts the time necessary to polish down to the target thickness. The signals of in-situ film thickness measurement usually contain a great deal of noise, and thus are unreliable to use directly to identify the end point of the wafer polish. This method uses a real-time optimal fit of the CMP control model to the in-situ thickness data to accurately and reliably determine the required polish time. The CMP real-time control method is as follows, as shown in FIG. 5:

1. The appropriate values for M, determined by the high feature area of the specific product being polished, constant k, wafer area $A_w$, and $F_{dn}$, the downforce value set in the polish recipe, are retrieved from a database, as indicated by the numeral 90 shown in FIG. 5. Values of M are set in the database by obtaining the value of mask-scale or reticle mask-scale M, from the photomask manufacturer for the given product's photomask, or by calculating the value of mask-scale or reticle mask-scale M from $A_m$ or $A_y$ as provided by the photomask manufacturer and using the following equations:

$M = A_m/A_w$, or $M = (A_w - A_v)/A_w$, or, alternatively, by calculating a local M from known or measured values of $A_m$ in a prescribed area $A_p$ surrounding the location of thickness measurements and using the formula $M = A_m/A_p$ Or, alternatively, M is calculated as a weighted average of a mask-scale or reticle mask-scale M and a local M as defined above.

2. Implicitly solve for $R_p$ in Equation M5, as indicated by the numeral 92 shown in FIG. 5, as determined with in-situ measured thickness used for $y_{m0}$ (thickness at start) and $y_m$. Implicit solutions can be performed by a variety of well-known textbook methods. The following example uses minimization of a quadratic objective function Φ:

Minimize Φ over the allowed range of the planar polish rate $R_p$ where $\Phi = \{y_m - (y_{v0} + h_c + R_p(t-t_c) + (1-M)h_c[\exp(kR_pA_w(t-t_c)/F_{dn}) - 1])\}^2$ The vector of measurements of $y_m$ by the in-situ substrate thickness sensor are used in this manner to create an optimal value for $R_p$. Optionally, create an alarm if resulting $R_p$ values are outside normal expectations, as illustrated by the optional step indicated by the numeral 94 shown in FIG. 5.

3. Implicitly solve Equation M5 for time t, as indicated by the numeral 96 shown in FIG. 5. The following example uses minimization of a quadratic objective function Φ:

Minimize Φ over the allowed range of polish times t where $\Phi = \{T_m - (y_{v0} + h_c + R_p(t-t_c) + (1-M)h_c[\exp(kR_pA_w(t-t_c)/F_{dn}) - 1])\}^2$ where $T_m$ is the target thickness for $y_m$. Optionally, create an alarm if the solved value of t is outside of normal expectations, as illustrated by the optional step indicated by the numeral 98 shown in FIG. 5.

4. Compare present polish time to the solution for polish time obtained in Step 3, above, as indicated by the numeral 100 shown in FIG. 5.

5. If actual polish time equals or exceeds the Step 3 polish time, then stop wafer polish, as indicated by the numeral 102 shown in FIG. 5. Otherwise, continue with the sequence beginning with Step 2.

The CMP control method in accordance with the present invention enables improved polishing results in both R2R and real-time control processes. While various embodiments of the CMP control method of the present invention and various contemplated modifications have been described above, other modifications and variations will likely occur to those persons skilled in the art. The foregoing description of the embodiments of the present invention is therefore exemplary and not limited to the specific embodiments that are disclosed above. The scope of the invention can only be ascertained with reference to the appended claims and the equivalents thereof.

What is claimed is:

1. A method for determining critical polish time $t_c$ using a polish pad during semiconductor manufacture of a structure having one or more mesas and one or more valleys, comprising the steps of:

obtaining the value of mask-scale or reticle mask-scale M;

determining a pad compression spring constant k of the polish pad;

measuring on a patterned structure high feature and low feature thicknesses at one or more identifiable locations, the first such measurement (before any polish) determining the values of $y_{m0}$ (high features) and $y_{v0}$ (low features);

determining the polish recipe value for downforce $F_{dn}$ pushing the structure against the polish pad;

determining the planar structure polish rate $R_p$; and computing a critical polish time prior to encountering one of the valleys according to:

$$t_c = \frac{F_{dn} - MkA_w(y_{m0} - y_{v0})}{kA_wR_p}. \quad [M1]$$

2. The method according to claim 1 wherein:

for time $t \leq t_c$, the removal rate on mesas $R_m$ and mesa thickness $y_m$ are given as $$R_m = \frac{R_p}{M} \quad [M\ 2]$$

$$y_m = y_{m0} + \frac{R_p t}{M}. \quad [M\ 3]$$

3. The method according to claim 1 wherein:

for time $t > t_c$, the removal rate on mesas $R_m$ and mesa thickness $y_m$ are given as $R_m = R_p + (1-M)(R_pA_w/F_{dn})h_ck \exp(kR_pA_w(t-t_c)/F_{dn})$ [M4]

$y_m = y_{v0} + h_c + R_p(t-t_c) + (1-M)h_c[\exp(kR_pA_w(t-t_c)/F_{dn}) - 1]$ [M5]

where the initial height from mesa to valley at time zero $h_0$ and critical height from mesa to valley a t time of initial pad contact $h_c$ are $h_0 = y_{m0} - y_{v0}$ [M6]

$$h_c = \frac{F_{dn}}{kA_wM}. \quad [M\ 7]$$

4. The method of claim 1 wherein the step of obtaining the value of mask-scale or reticle mask-scale M comprises obtaining the value from a photomask manufacturer for a given structure's photomask.

5. The method of claim 1 wherein the step of obtaining the value of mask-scale or reticle mask-scale M comprises calculating the value of mask-scale or reticle mask-scale M from $A_m$ or $A_v$ as provided by the photomask manufacturer and using the following equations $M = A_m/A_w$, or $M = (A_w - A_v)/A_w$.

6. The method of claim 1 wherein the step of obtaining the value of mask-scale or reticle mask-scale M comprises calculating a local M from known or measured values of $A_m$ in a prescribed area $A_p$ surrounding the location of thickness measurements and using the equation $M = A_m/A_p$.

7. The method of claim 1 wherein the step of obtaining the value of mask-scale or reticle mask-scale M comprises calculating M as a weighted average of a mask-scale or reticle mask-scale M aid a local M.

8. The method according to claim 3 wherein the pad compression spring constant k of the polish pad is given by:

$k = F_{dn}/(h_c A_w M)$ and wherein:

for time $t > t_c$, the removal rate on mesas $R_m$ and mesa thickness $y_m$ are given as $$R_m = R_p[1 + \{(1-M)/M\} \exp(R_p(t-t_c)/(Mh_c))] \quad [M8]$$

$$y_m = y_{v0} + h_c + R_p(t-t_c) + (1-M)h_c[\exp(R_p(t-t_c)/Mh_c) - 1] \quad [M9]$$

where the initial height from mesa to valley at time zero $h_0$ and critical height from mesa to valley at time of initial pad contact $h_c$ are $$h_0 = y_{m0} - y_{v0} \quad [M6]$$

$$h_c = \frac{F_{dn}}{kA_w M}. \quad [M\ 7]$$

9. The method according to claim 1 wherein:

$$R_p = -CS\frac{F_{dn}}{A_w} \quad [M\ 10]$$

where
C=Preston's coefficient
S=pad-to-structure speed.

10. The method according to claim 1, further comprising the step of determining the planar structure polish rate $R_p$, comprising the additional steps of:
   a. measuring the substrate film thickness at one or more identifiable locations on a planar (unpatterned) structure;
   b. polishing the structure for a metered amount of time;
   c. re-measuring the substrate film thickness at the same locations as in Step a, above; and
   d. differencing the measurements (Step c measurements minus Step a measurements), averaging the results, and dividing by the polish time to calculate $R_p$, the planar structure polish rate.

11. The method according to claim 10, further comprising the step of determining the polish pad compression spring constant k, comprising the additional steps of:
   e. measuring high feature and low feature thicknesses at one or more identifiable locations on the structure, the first such measurement (before any polishing) determining the values of $y_{m0}$ (high features) and $y_{v0}$ (low features);
   f. subsequently measuring after the first post-polish measurements to determine the values of $y_m$ (high features) and $y_v$ (low features);
   g. polishing the set of patterned structures sequentially with incremental polish times, the increments being typically 5 to 30 seconds, using an increment in polish time such that the incremental polish time multiplied by the number of structures in the set equals or exceeds the polish time normally used for the given set of patterned structures;
   h. re-measuring high feature and low feature thickness on each structure at the same locations as Step e, above;
   i. identifying the critical polish time as the polish time of the first structure in the sequence of increasing polish times that exhibits low feature thickness loss, and identifying the critical height $h_c$ by the high and low feature thickness difference for this first structure;
   j. repeating Steps e through i as needed to improve resolution (polishing with times in the vicinity of the last result in Step i) and to replicate results; and
   k. using the resulting values of $t_c$ and $h_c$ in Equation M1 to solve for k.

12. The method according to claim 10, further comprising the step of determining the polish pad compression spring constant k, comprising the additional steps of:
   e. measuring high feature and low feature thicknesses at one or more identifiable locations on a patterned structure, the first such measurement (before any polishing) determining the values of $y_{m0}$ (high features) and $y_{v0}$ (low features);
   f. subsequently measuring after the first post-polish measurements to determine the values of $y_m$ (high features) and $y_v$ (low features);
   g. polishing the patterned structure for a short (typically 5 to 30 seconds) metered amount of time;
   h. re-measuring high feature and low feature thickness at the same locations as Step e;
   i. repeating Steps g and h, until low feature thickness loss is noted;
   j. obtaining cumulative polish time by summing the time of each polish of Step g for providing an estimate for $t_c$ and high minus low feature thickness for providing an estimate for $h_c$;
   k. repeating Steps e through j to improve resolution (polish with times in the vicinity of the result in Step j) and replicate results as needed; and
   l. when an adequately repeatable and accurate result for $t_c$ and $h_c$ is obtained, use Equation M1 to solve for k given the values of $t_c$ and $h_c$.

13. A method for production wafer polish using a CMP Run-to-Run control model used to control production of wafer polish, comprising the steps of:
   a. initializing production on a CMP tool by determining the planar wafer polish rate $R_p$;
   b. measuring incoming production wafer high ($y_{m0}$) and low ($y_{v0}$) feature thickness at one or more identifiable locations on the wafer;
   c. determining appropriate values for M, determined by the high feature area of a specific product being polished, spring constant k of a polish pad, wafer area $A_w$, and $F_{dn}$, the downforce value set in the polish recipe, retrieved from a database;
   d. calculating critical time constant $t_c$ given by:

$$t_c = \frac{F_{dn} - MkA_w(y_{m0} - y_{v0})}{kA_w R_p} \quad [M1]$$

e. substituting critical time constant $t_c$ into the following equation:

$$y_m = y_{m0} + \frac{R_p t_c}{M}$$

and performing the following conditional logic:
   If $y_m \leq T_m$, where $T_m$ is the post-polish thickness target, then use $$y_m = y_{mo} + \frac{R_p t}{M} \quad [\text{M 3}]$$

in Step f; otherwise, use $$y_m = y_{v0} + h_c + R_p(t-t_c) + (1-M)h_c[\exp(kR_pA_w(t-t_c)/F_{dn})-1] \quad [\text{M5}];$$

f. implicitly solving for polish time from Equation M3 or M5 as determined in Step e with target $T_m$ substituted for $y_m$;

g. measuring post-polish $y_m$, $y_v$ at the same locations used in Step b;

h. implicitly solving Equation M3 or M5, as determined in Step e, for $R_p$ using measurements from Step g;

i. filtering the new value for $R_p$ to produce a new estimated value of $R_p$ to be used in Steps b through f for the next wafer or batch of wafers to be polished;

j. determining the recipe value for polish time for the next wafer or batch of wafers to be polished by repeating the above sequence starting with Step b, above, for this next wafer or batch of wafers using the new estimated value of $R_p$ determined in Step i, above; and k. setting the recipe value for polish time on the polish tool prior to polishing the corresponding wafer or batch of wafers.

14. The method according to claim 13 wherein the step of determining the planar wafer polish rate $R_p$ comprises the steps of:

l. measuring the substrate film thickness at one or more identifiable locations on a planar (unpatterned) wafer;

m. polishing the wafer for a metered amount of time;

n. re-measuring the substrate film thickness at the same locations as in Step 1, above; and o. differencing the measurements (Step n measurements minus Step 1 measurements), averaging the results, and dividing by the polish time to calculate $R_p$, the planar wafer polish rate.

15. The method according to claim 13 wherein Step f comprises implicit solution performed by minimization of a quadratic objective function $\Phi$ by:

minimizing $\Phi$ over the allowed range of polish times t where $$\Phi = \left\{ T_m - \left[ y_{mo} + \frac{R_p t}{M} \right] \right\}^2$$

for Equation M3 selected in Step e;

$$\Phi = \{T_m - (y_{v0} + h_c + R_p(t-t_c) + (1-M)h_c[\exp(kR_pA_w(t-t_c)/F_{dn})-1])\}^2$$

for Equation M5 selected in Step e, where the upper and lower allowed limits of the manipulated variable of polish time t are respectively indicated by u and l subscripts and are such that $$t_l \leq t \leq t_u.$$

16. The method according to claim 13 wherein Step h comprises implicit solution performed by minimization of a quadratic objective function $\Phi$ by:

minimizing $\Phi$ over the allowed range of planar polish rates $R_p$ where $$\Phi = \left\{ y_m - \left[ y_{mo} + \frac{R_p t}{M} \right] \right\}^2$$

for Equation M3 selected in Step e;

$$\Phi = \{y_m - (y_{v0} + h_c + R_p(t-t_c) + (1-M)h_c[\exp(kR_pA_w(t-t_c)/F_{dn})-1])\}^2$$

for Equation M5 selected in Step e, where $y_m$ is the measurement obtained in Step g.

17. The method according to claim 13 wherein Step h comprises filtering selected from among the group consisting of Kalman or EWMA filters.

18. The method according to claim 17 wherein EWMA filtering is used:

$$R_p\text{new\_estimate} = \lambda^*(R_p\text{new\_value}) + (1-\lambda)^*R_p\text{old\_estimate}$$

where the EWMA filter constant k has a value between 0 and 1.

19. The method according to claim 13, further comprising the step of:

l. for the next wafer or batch of wafers, repeating the sequence of steps starting with Step b.

20. A method for production wafer polish using a CMP real-time control model used to control production of wafer polish, comprising the steps of:

a. determining the appropriate values for M, determined by the high feature area of a specific product being polished, spring constant k of a polish pad, wafer area $A_w$, and $F_{dn}$, the downforce value set in the polish recipe, retrieved from a database;

b. implicitly solving for $R_p$ in $$y_m = y_{v0} + h_c + R_p(t-t_c) + (1-M)h_c[\exp(kR_pA_w(t-t_c)/F_{dn})-1] \quad [\text{M5}]$$

as determined with in-situ measured thickness used for $y_{m0}$ (thickness at start) and $y_m$;

c. implicitly solving Equation M5 for time t;

d. comparing present polish time to the solution for polish time obtained in Step c; and p1 e. if actual polish time equals or exceeds the Step c polish time, then stopping wafer polish.

21. The method according to claim 20 wherein Step b comprises implicit solution performed by minimization of a quadratic objective function $\Phi$ by:

minimizing $\Phi$ over the allowed range of the planar polish rate $R_p$ where $$\Phi = \{y_m - (y_{v0} + h_c + R_p(t-t_c) + (1-M)h_c[\exp(kR_pA_w(t-t_c)/F_{dn})-1])\}^2$$

wherein the vector of measurements of $y_m$ by the in-situ substrate thickness sensor are used in this manner to create an optimal value for $R_p$.

22. The method according to claim 20 wherein Step c comprises implicit solution performed by minimization of a quadratic objective function $\Phi$ by:

minimizing $\Phi$ over the allowed range of polish times t where $$\Phi = \{T_m - (y_{v0} + h_c + R_p(t-t_c) + (1-M)h_c[\exp(kR_pA_w(t-t_c)/F_{dn})-1])\}^2$$

where $T_m$ is the target thickness for $y_m$.

23. The method according to claim 20, further comprising the step of:

f. creating an alarm if resulting $R_p$ values determined in Step c are outside normal expectations.

* * * * *